US010203373B1

(12) United States Patent
Horst et al.

(10) Patent No.: US 10,203,373 B1
(45) Date of Patent: Feb. 12, 2019

(54) SYSTEMS AND METHODS FOR USING PROFILES TO MONITOR GENERATORS

(71) Applicant: HONDA MOTOR CO., LTD., Tokyo (JP)

(72) Inventors: David Andrew Horst, Alpharetta, GA (US); Narendran Ravi, Torrance, CA (US)

(73) Assignee: HONDA MOTOR CO., LTD, Tokyo (JP)

( * ) Notice: Subject to any disclaimer, the term of this patent is extended or adjusted under 35 U.S.C. 154(b) by 0 days.

(21) Appl. No.: 15/803,061

(22) Filed: Nov. 3, 2017

(51) Int. Cl.
| | |
|---|---|
| G01R 31/34 | (2006.01) |
| F02D 29/06 | (2006.01) |
| G01R 15/12 | (2006.01) |
| H04L 29/08 | (2006.01) |
| G01P 15/00 | (2006.01) |
| H04W 84/18 | (2009.01) |

(52) U.S. Cl.
CPC ........... *G01R 31/343* (2013.01); *F02D 29/06* (2013.01); *G01R 15/125* (2013.01); *H04L 67/12* (2013.01); *G01P 15/00* (2013.01); *H04W 84/18* (2013.01)

(58) Field of Classification Search
CPC .... G01R 31/343; G01R 15/125; G01R 21/00; G06F 1/26; G06F 1/28; G06F 19/00; G08C 15/06; F02D 29/06; H04L 67/12
USPC .. 340/635, 656, 657, 539.1, 539.23, 870.02; 700/287; 702/62
See application file for complete search history.

(56) References Cited

U.S. PATENT DOCUMENTS

| | | |
|---|---|---|
| 5,943,201 A | 8/1999 | Walker et al. |
| 7,166,937 B2 | 1/2007 | Wilson et al. |
| 2009/0237258 A1 | 9/2009 | Heck et al. |
| 2010/0191487 A1 | 7/2010 | Rada et al. |
| 2010/0217549 A1* | 8/2010 | Galvin ............... H04B 3/54 702/62 |
| 2011/0213506 A1* | 9/2011 | Gamboa Tuesta ...... F03B 11/00 700/287 |
| 2012/0229295 A1 | 9/2012 | Sharma et al. |
| 2012/0302092 A1 | 11/2012 | Kaps et al. |

(Continued)

FOREIGN PATENT DOCUMENTS

| | | |
|---|---|---|
| CN | 103076544 A | 5/2013 |
| KR | 20110002725 A | 1/2011 |

*Primary Examiner* — Hung T Nguyen
(74) *Attorney, Agent, or Firm* — Arent Fox LLP

(57) ABSTRACT

The disclosure provides an apparatus, system, and method for monitoring multiple portable generators. A monitoring device may include at least one electrical plug to connect to a respective electrical socket of multiple generators. The monitoring device may include a plurality of sensors, a wireless modem, and a processor communicatively coupled to the plurality of sensors, the wireless modem, and to a memory storing executable instructions. The monitoring device may generate a unique identifier for a connected generator of the multiple generators when plugged into the electrical socket of the connected generator. The monitoring device may monitor operational parameters of the connected generator based on the plurality of sensors. The monitoring device may store a respective profile for each of the multiple generators, each profile associated with a respective unique identifier and including the operational parameters. The monitoring device may transmit the profile to a mobile device via the wireless modem.

20 Claims, 6 Drawing Sheets

(56) References Cited

U.S. PATENT DOCUMENTS

| | | |
|---|---|---|
| 2013/0175882 A1 | 7/2013 | Hayashi et al. |
| 2013/0238150 A1 | 9/2013 | Vaum et al. |
| 2014/0098247 A1 | 4/2014 | Rao et al. |
| 2015/0311903 A1 | 10/2015 | Frampton |
| 2015/0348394 A1 | 12/2015 | De La Borbolla et al. |
| 2016/0049789 A1 | 2/2016 | Ng et al. |

\* cited by examiner

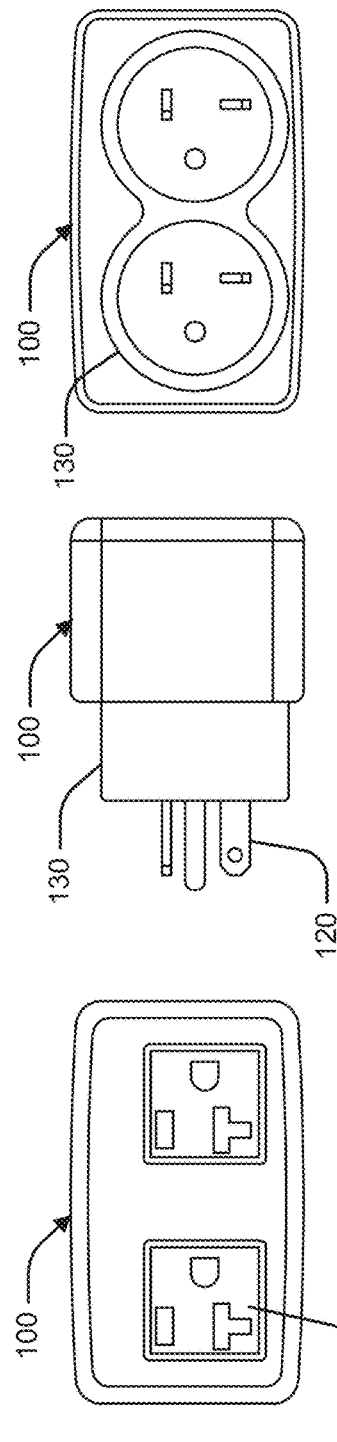
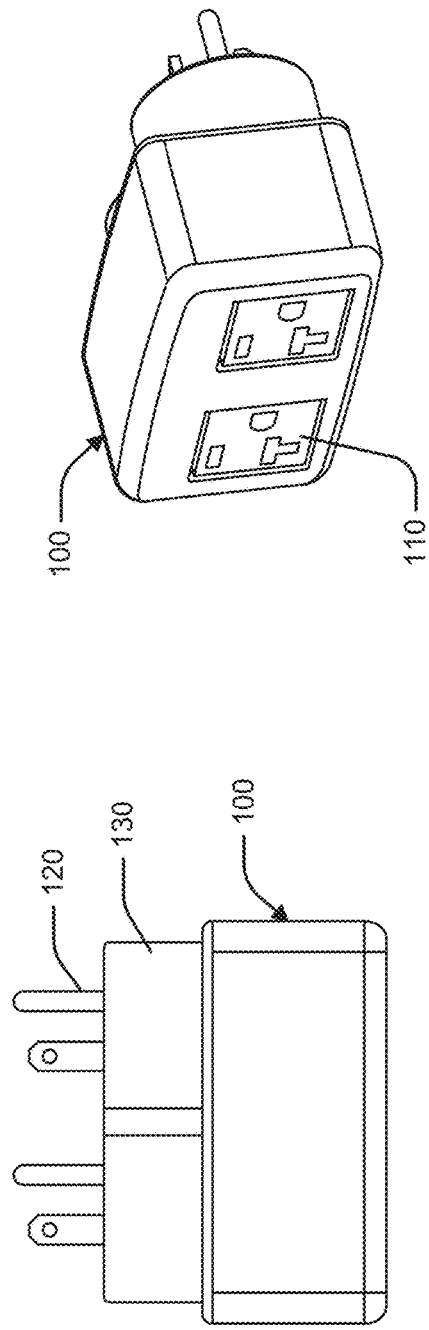

SYSTEMS AND METHODS FOR USING PROFILES TO MONITOR GENERATORS

BACKGROUND

A portable generator may include an engine that converts fuel into kinetic energy and a generator that converts the kinetic energy into electricity. Portable generators may be used to provide electricity in a variety of scenarios such as backup power in emergencies, and remote power for camping or construction.

A portable generator may require regular service and maintenance. For example, a portable generator may include a fuel tank that is to be refilled as the fuel is consumed during use. Additionally, a portable generator may be lubricated with oil that should be regularly replaced. Use of the portable generator may be irregular or sporadic. In view of the foregoing, there is a need for techniques for monitoring generators. Further advantages will become apparent from the disclosure provided below.

SUMMARY

This summary is provided to introduce a selection of concepts in a simplified form that are further described below in the DETAILED DESCRIPTION. This summary is not intended to identify key features of the claimed subject matter, nor is it intended to be used as an aid in determining the scope of the claimed subject matter.

In an aspect, the disclosure provides an apparatus for monitoring multiple portable generators. The monitoring device may include at least one electrical plug to connect to a respective electrical socket of multiple generators. The monitoring device may include a plurality of sensors, a wireless modem, and a processor communicatively coupled to the plurality of sensors, the wireless modem, and to a memory storing executable instructions. The monitoring device may generate a unique identifier for a connected generator of the multiple generators when plugged into the electrical socket of the connected generator. The monitoring device may monitor operational parameters of the connected generator based on the plurality of sensors. The monitoring device may store a respective profile for each of the multiple generators, each profile associated with a respective unique identifier and including the operational parameters. The monitoring device may transmit the profile to a mobile device via the wireless modem.

In another aspect, the disclosure provides a method of monitoring multiple generators. The method may include generating, at a monitoring device, a unique identifier for a connected generator when at least one electrical plug of the monitoring device is plugged into an electrical socket of the connected generator. The method may include monitoring one or more operational parameters of the connected generator based on a plurality of sensors of the monitoring device. The method may include storing a respective profile for each of the multiple generators, each profile associated with a respective unique identifier and including the one or more operational parameters of the respective generator. The method may include transmitting the profile to a mobile device via a wireless modem of the monitoring device.

In another aspect, the disclosure provides a system for monitoring generators. The system may include a monitoring device that obtains operational parameters of a connected generator based on a plurality of sensors. The system may include a mobile device that receives a profile of the connected generator from the monitoring device. The profile is associated with a unique identifier for the connected generator. The system may include a server that remotely stores profiles of generators and provides access to the profiles based on the unique identifier. The monitoring device may generate the unique identifier for the connected generator of the multiple generators when at least one electrical plug of the monitoring device is plugged into an electrical socket of the connected generator. The monitoring device may monitor the one or more operational parameters of the connected generator based on the plurality of sensors. The monitoring device may store the respective profile for each of the multiple generators, each profile associated with a respective unique identifier and including the one or more operational parameters of the respective generator. The monitoring device may transmit the profile to a mobile device via the wireless modem.

BRIEF DESCRIPTION OF THE DRAWINGS

The novel features believed to be characteristic of the disclosure are set forth in the appended claims. In the descriptions that follow, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a preferred mode of use, further objects and advances thereof, will be best understood by reference to the following detailed description of illustrative aspects of the disclosure when read in conjunction with the accompanying drawings, wherein:

FIG. 1A is a front view of an exemplary monitoring device according to an aspect of the present disclosure;

FIG. 1B is a side view of the exemplary monitoring device of FIG. 1A;

FIG. 1C is a rear view of the exemplary monitoring device of FIG. 1A;

FIG. 1D is a top view of the exemplary monitoring device of FIG. 1A;

FIG. 1E is a perspective view of the exemplary monitoring device of FIG. 1A;

DETAILED DESCRIPTION

Figure 2:
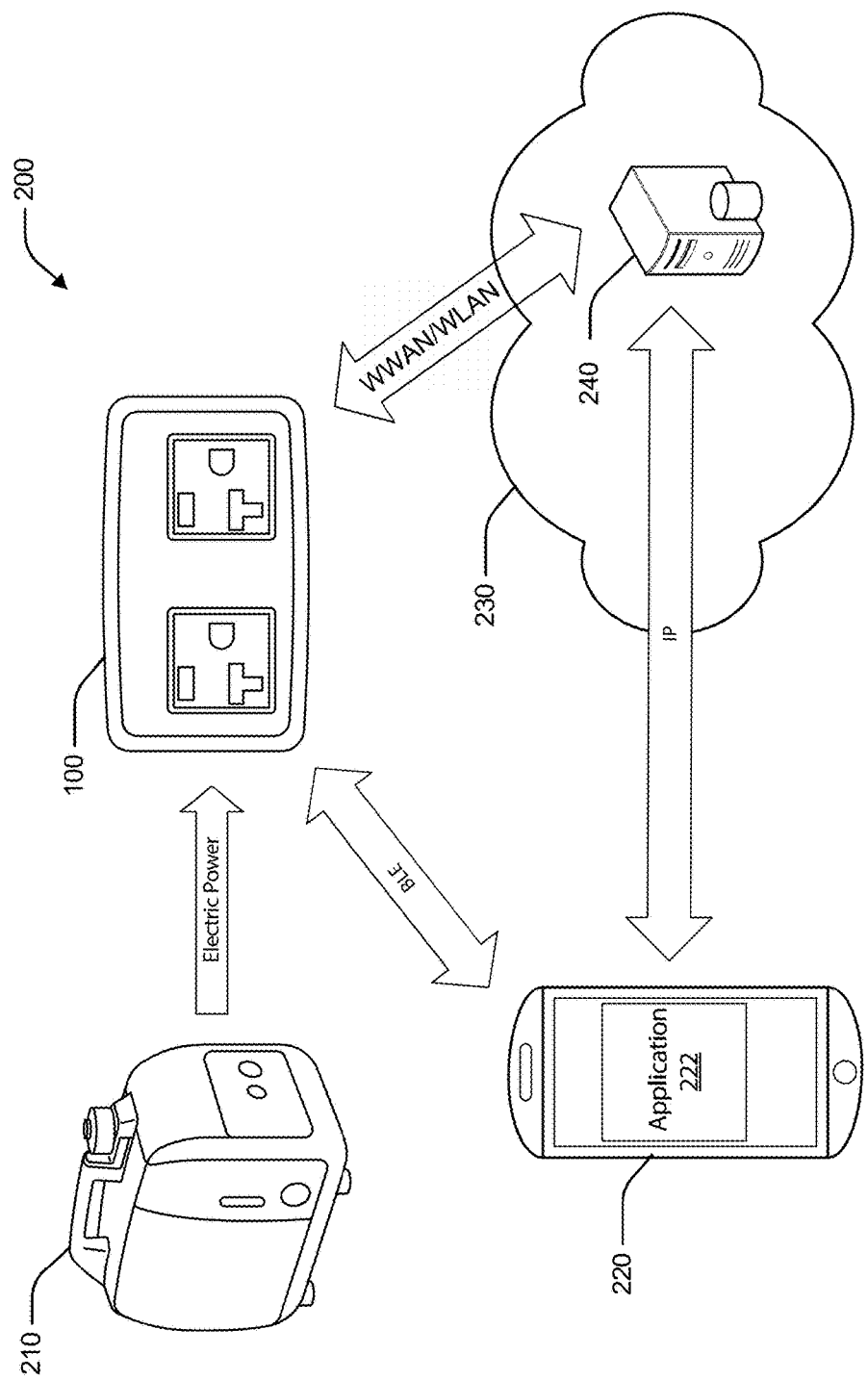
FIG. 2 is a network diagram of an operating environment for the exemplary monitoring device according to an aspect of the present disclosure.

The following includes definitions of selected terms employed herein. The definitions include various examples and/or forms of components that fall within the scope of a term and that may be used for implementation. The examples are not intended to be limiting.

A "processor," as used herein, processes signals and performs general computing and arithmetic functions. Signals processed by the processor may include digital signals, data signals, computer instructions, processor instructions, messages, a bit, a bit stream, or other computing that may be received, transmitted and/or detected.

A "bus," as used herein, refers to an interconnected architecture that is operably connected to transfer data between computer components within a singular or multiple systems. The bus may be a memory bus, a memory controller, a peripheral bus, an external bus, a crossbar switch, and/or a local bus, among others.

A "memory," as used herein may include volatile memory and/or non-volatile memory. Non-volatile memory may include, for example, ROM (read only memory), PROM (programmable read only memory), EPROM (erasable PROM) and EEPROM (electrically erasable PROM). Volatile memory may include, for example, RAM (random access memory), synchronous RAM (SRAM), dynamic RAM (DRAM), synchronous DRAM (SDRAM), double data rate SDRAM (DDR SDRAM), and/or direct RAM bus RAM (DRRAM).

An "operable connection," as used herein may include a connection by which entities are "operably connected", is one in which signals, physical communications, and/or logical communications may be sent and/or received. An operable connection may include a physical interface, a data interface and/or an electrical interface.

FIGS. 1A-1E illustrate an example monitoring device 100. The monitoring device 100 may be a physically separate unit that can be attached to a portable generator for providing information regarding the generator. In an aspect, the monitoring device 100 may connect to the output power sockets of a portable generator. For example, as illustrated, the monitoring device 100 may include prongs 120 for insertion into a power socket of a portable generator. The shape and size of the prongs 120 may vary based on plug standards in use in various countries and regions. The power sockets of portable generators may generally conform to the plug standards used for building electric sockets. In an aspect, the monitoring device 100 may include a projection 130, which may conform to socket shapes of some standards. The projection 130 may provide an interference fit of the monitoring device 100 with the portable generator to provide mechanical resistance against separation of the monitoring device 100 from the portable generator. Without the projection 130, the prongs 120 may also provide mechanical resistance against separation of the monitoring device 100 from the portable generator.

The monitoring device 100 may also include a socket 110 that allows connection of an electric device. That is, instead of connecting the electric device directly to the socket of the portable generator, the electric device may be connected to the socket 110 of the monitoring device. The monitoring device 100 may receive electric power at the prongs 120 and provide the majority of the electric power to an attached electric device. As discussed in further detail below, the monitoring device 100 may draw a relatively small amount of electric power for powering electronics for monitoring and reporting information regarding the portable generator. For example, the monitoring device 100 may wirelessly communicate with a mobile device to provide information regarding the portable generator to an operator.

FIG. 2 is a network diagram of an operating environment 200 for a monitoring device 100. The operating environment 200 may include a portable generator 210, a mobile device 220, a network 230, and a server 240. The portable generator 210 may be an electric generator including a fuel tank, an engine, a generator, and one or more electric output sockets. The portable generator 210 may consume fuel from the fuel tank to run the engine, which drives the generator to power the electric output sockets. In an aspect, the portable generator 210 may not have any communication capabilities. The portable generator 210 may not detect the monitoring device 100 and may operate normally to provide electric power to the monitoring device 100.

The mobile device 220 may be a portable electronic device that communicates with the monitoring device 100. The mobile device 220 may also include or be referred to by those skilled in the art as a user equipment (UE), mobile station, a subscriber station, a mobile unit, a subscriber unit, a wireless unit, a remote unit, a wireless device, a wireless communications device, a remote device, a mobile subscriber station, an access terminal, a mobile terminal, a wireless terminal, a remote terminal, a handset, a user agent, a mobile client, a client, or some other suitable terminology. The mobile device 220 may be a cellular phone, a smart phone, a personal digital assistant (PDA), a wireless modem, a wireless communication device, a handheld device, a tablet computer, a laptop computer, a cordless phone, a smart watch, a wireless local loop (WLL) station, an entertainment device, a vehicular component, a customer premises equipment (CPE), or another device capable of communicating in network 230.

The mobile device 220 may include an application executable by a processor of the mobile device 220 for facilitating communication with the monitoring device 100. In an aspect, the application may establish a wireless connection with the monitoring device 100. In an implementation, a Bluetooth® low energy (BLE) connection may be used, but other radio-frequency (RF) connections such as Wi-Fi, cellular, and others may be used. The application may be used for both input and output with the monitoring device 100. The application may be used to identify the portable generator 210 to the monitoring device 100. For example, upon establishing the connection between the mobile device 220 and the monitoring device 100, the application may prompt an operator to identify the portable generator 210. For instance, the application may present a list of portable generators associated with profiles on the monitoring device 100. The generators may be identified by a model number, serial number, or nickname. The application may also provide an option to add a new generator. When the operator adds a new generator, the operator may provide a serial number, make/model information, and a nickname. Once the monitoring device 100 is associated with the connected portable generator 210, the application may allow the operator to indicate events such as a refueling event, changing oil event, or unmonitored usage. The application may prompt the operator to input values for the specific event, as discussed in further detail below.

The mobile device 220 may also serve as an output display for the monitoring device 100. The mobile device 220 may display real-time and/or historical operating data of the portable generator 210 as captured by the monitoring device. For example, the application of the mobile device may display operating data such as engine run time, number of engine off cycles, an engine RPM, electric current (I) value, electric voltage (V) value, estimated fuel level, and/or oil residual time value. The application may also provide event notifications regarding the operating data. For example, the application may provide a notification to an operator when any of the operational data values crosses a threshold of an operational range. For instance, the application 222 may generate a notification if the I value or V value falls below a specified value. Additionally, the application may provide a notification when either the estimated fuel level or the oil residual time value falls below a threshold.

The network 230 may be a communications network for transmitting data between the mobile device 220 and the server 240. The network 230 may use one or more connection types. In an aspect, the data may be transmitted between the mobile device 220 and the server 240 at a network layer using, for example, the internet protocol (IP). In another aspect, the monitoring device 210 may communicate with the storage server 240 over the network 230 where the network 230 may include a wireless wide area network (WWAN) or via a wireless local area network (WWAN) including a local router.

The server 240 may be a computer server for storing profile information associated with one or more portable generators 210. In an aspect, the server 240 may be a storage server that stores the profile information in association with the unique ID for each portable generator 210. The server 240 may be accessed by the application on the mobile device 220. The mobile device 220 may receive the profile information from the monitoring device 100 and upload the profile information to the server 240. The server 240 may allow access to the profiles to one or more mobile devices. For example, an instance of the application running on the mobile device 220 may be executed by a personal computer to remotely obtain access to the profile information. In a use case, a business operating multiple generators (e.g., for construction) may access the server 240 from a central location to track the usage and maintenance requirements of all of the generators. In another use case, an operator may change mobile devices but maintain access to the profile of a portable generator 210 by connecting to the server 240 and providing the unique ID for the portable generator 210.

Figure 3:
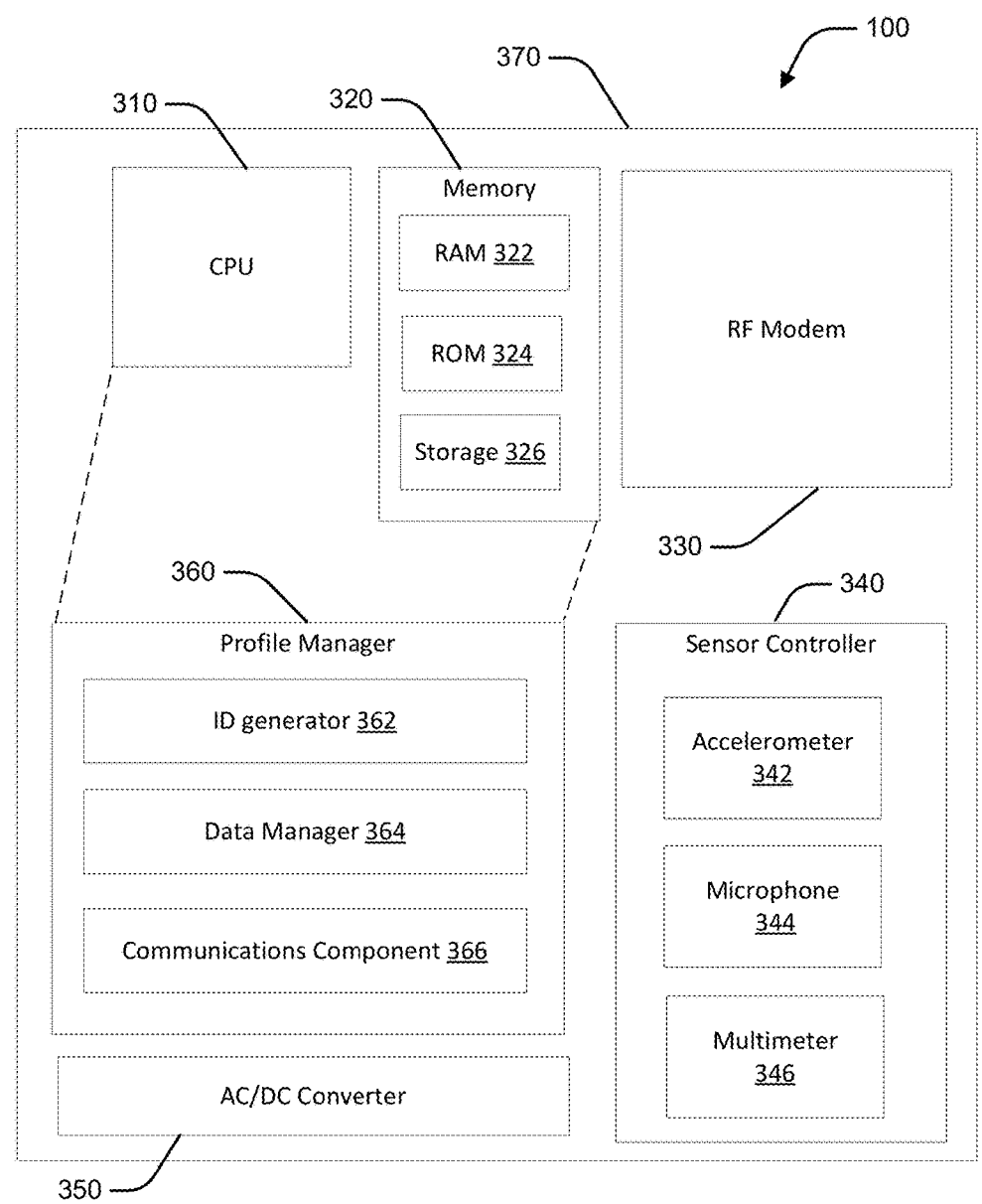
FIG. 3 is a schematic diagram of components of the exemplary example monitoring device according to an aspect of the present disclosure.

FIG. 3 is a schematic diagram of components of the example monitoring device 100. The monitoring device 100 may include a central processing unit (CPU) 310, a memory 320, an RF modem 330, a sensor controller 340, an AC/DC converter 350, and a profile manager 360. In an aspect, the components may be included within a case 370, which may include one or more seals.

The CPU 310 may include one or more processors for executing instructions. An example of CPU 310 can include, but is not limited to, any processor specially programmed as described herein, including a controller, microcontroller, application specific integrated circuit (ASIC), field programmable gate array (FPGA), system on chip (SoC), or other programmable logic or state machine. The CPU 310 may include other processing components such as an arithmetic logic unit (ALU), registers, and a control unit. The CPU 310 may include multiple cores and may be able to process different sets of instructions and/or data concurrently using the multiple cores to execute multiple threads.

Memory 320 may be configured for storing data and/or computer-executable instructions defining and/or associated with firmware of monitoring device 100 (e.g., sensor controller 340 and profile manager 360), and CPU 114 may execute the firmware. Memory 320 may represent one or more hardware memory devices accessible to monitoring device 100. An example of memory 320 can include, but is not limited to, a type of memory usable by a computer, such as random access memory (RAM), read only memory (ROM), tapes, magnetic discs, optical discs, volatile memory, non-volatile memory, and any combination thereof. In the illustrated example, memory 320 includes RAM 322, ROM 324, and storage 326. The RAM 322 may be a hardware component such as one or more dual in-line memory modules (DIMM). The ROM 324 may store executable instructions such as the firmware. The storage 326 may be a non-volatile memory for storing instructions and/or data. In an aspect, the storage 326 may store device profiles when the monitoring device is unpowered.

The radio frequency (RF) modem 330 may be a wireless modem for providing communication between the monitoring device 100 and a mobile device. The RF modem 330 may include an antenna, digital signal processor (DSP), and its own processor and memory. The RF modem 330 may implement one or more wireless communications protocols. In an aspect, for example, the RF modem 330 may implement a Bluetooth® Low Energy (BLE), Wi-Fi, or other communications protocol. The RF modem 330 may establish a connection (i.e., be paired) with a single mobile device. As discussed in further detail below, the RF modem 330 may receive commands from the mobile device and transmit information regarding the portable generator to the mobile device. In another aspect, the RF modem 330 may communicate with the storage server 240 via wireless wide area network (WWAN) or via a wireless local area network (WWAN) including a local router.

The sensor controller 340 may control multiple sensors of the monitoring device 100. For example, the multiple sensors may include an accelerometer 342, a microphone 344, and an electronic multimeter 346. The accelerometer 342 may measure movement of the monitoring device 100. In an aspect, the accelerometer 342 may provide input to determine an engine revolutions per minute (RPM). In another aspect, the accelerometer 342 may detect larger movements of the monitoring device 100. For example, a large vertical or horizontal movement may indicate that the monitoring device 100 and/or a generator attached thereto may be in the process of being moved or stolen, and the movement may be reported to an operator. The microphone 344 may detect an audio signal. The audio signal, for example, may include sound produced by the engine of the portable generator 210. The audio signal may also be an input to determine the engine RPM. The multimeter 346 may measure properties of the electricity supplied by the portable generator 210. The multimeter 346 may include one or more of a voltmeter, ammeter, or ohmmeter. The multimeter 346 may, for example, output a current and voltage supplied by the portable generator 210.

The AC/DC converter 350 may convert alternating current (AC) produced by the portable generator into direct current (DC) used by the components of the monitoring device 100.

The profile manager 360 may establish and maintain profiles for each generator connected to the monitoring device 100. The profile manager 360 may also transmit the profiles to the mobile device 220. The profile manager 360 may include an ID generator 362 for determining a unique ID for a portable generator 210 connected to the monitoring device 100, a data manager 364 for storing operational data in a profile associated with the unique ID, and a communications component 366 for transmitting a profile and/or operational data to the mobile device 220.

The ID generator 362 may generate a unique ID for a portable generator 210. The unique ID may be generated based on input from an operator via the mobile device 220. For example, the operator may enter a generator serial number manually, by scanning a code, or by taking a photograph. The ID generator 362 may generate a unique ID based on the serial number. In an aspect, the monitoring device 100 may not communicate directly with the portable generator, which may have no communications capabilities.

The monitoring device 100 may be unpowered when disconnected from a portable generator 210 and when the portable generator 210 is not running. Accordingly, when the monitoring device 100 is powered on, the monitoring device 100 may not know to which portable generator 210 the monitoring device 100 is connected. The monitoring device 100 may operate in a startup mode until the identity of the portable generator 210 is provided. In the startup mode, the monitoring device 100 may store collected operational data in association with a new unique ID. When a mobile device 220 connects to the monitoring device 100, the ID generator 362 may receive an identification of the portable generator 210. If the portable generator 210 is associated with a known unique ID, the new unique ID used for the startup mode may be merged with a saved profile for the known unique ID. If the portable generator 210 is not associated with a known unique ID, the new unique ID used for the startup mode may be assigned to the connected portable generator 210. The monitoring device 100 may also receive information regarding the portable generator 210 such as a serial number, make and model, and nickname. In an aspect, the make and model may not be recognized by the monitoring device 100 (e.g., a new model generator). The mobile device 220 may also provide a model configuration including generator model characteristic parameters, fuel level calculation settings, and engine RPM algorithm settings. The mobile device 220 may also provide any prior usage or current state information provided by the operator. The ID generator 362 may store the information regarding the portable generator 210 in the profile when creating a new unique ID.

The data manager 364 may store data in the profile for the connected portable generator 210. The data manager 364 may obtain the data from the sensor controller 340 and the communications component 366. For example, the communications component 366 may receive data from the mobile device such as an indication of refueling including either a new fuel level or an added amount of fuel. Similarly, the communications component 366 may receive an indication of a lubricant change. The data manager 364 may obtain data from the sensor controller 340 on a periodic basis, or in response to particular events. The data manager 364 may determine operational data based on the obtained data.

The operational data may include engine run time. Engine run time may be an incremental value saved to the profile at each engine off event. For example, the sensor controller 340 may measure the running time of the portable generator at a data resolution of 1 minute. During the startup mode, the communications component 366 may be able to modify the start data value. For example, the portable generator may have been running without the monitoring device connected. The operator may provide an estimate of the unmonitored engine run time, which may be added to the stored engine run time.

The operational data may include a number of engine off cycles. The number of engine off cycles may be a value that increases at each engine one event and is saved in the profile for the portable generator. During the startup mode, the communications component 366 may be able to modify the stored number of engine cycles value. For example, the portable generator may have been running without the monitoring device connected. The operator may provide an estimate of the number of unmonitored engine off cycle, which may be added to the stored engine off cycles value.

The operational data may include an engine RPM. The engine RPM may be a value detected by the microphone 344 and accelerometer 342, which is calculated by a dedicated algorithm based on known properties associated with the model of the connected generator. The known properties may be pre-loaded into the monitoring device 100 or received when configuring a profile for the connected generator. For example, in an implementation, the engine RPM may be provided by the sensor controller 340 as a 4 bytes value with a resolution of 30 rpm and theoretical maximum value of 5100 rpm. The engine RPM may be reported to the mobile device via the communications component 366. The mobile application may display the engine RPM value on a scale of the operating range for the portable generator.

The operational data may include an electric current (I) value. The I value may be a root mean square (RMS) value calculated on a 1 second period by the multimeter 346. The I value may be a sum of I values for both sockets 110. In an implementation, the sensor controller 340 may provide the I value as a 4 bytes value with a resolution of 0.3 A.

The operational data may include an electric voltage (V) value. The V value may be a RMS value calculated on 1 sec period detected by the multimeter 346. The V value may be a sum of V values for both sockets 110. In an implementation, the sensor controller 340 may provide the V value as a 4 bytes value with a resolution of 1 V.

In an aspect, the operational data may include an electric power value. The electric power value may be determined based on the I value and the V value as V*I. The electric power value may be determined by the monitoring device 100, mobile device 220, or storage server 240.

The operational data may include an estimated fuel level. The fuel level value may be decremented and calculated with reference to the power value (V*I) and consumption rate. The consumption rate may be based on the model of the portable generator (e.g., a model characteristic parameter of the model). In an implementation, the estimated fuel level may have a resolution of 10% of the fuel tank capacity. At every refill, the mobile device may send a command with a parameter specifying either the new fuel level or the amount of fuel. The data manager 364 may reset the estimated fuel level in response to the command.

The operational data may include an oil residual time value. The oil residual time value may be decremented based on the engine run time value. In an implementation, the oil residual time value has a resolution of 10% of oil lifetime. At every refill, the mobile device may send a command with a parameter specifying the remaining hours to reset the oil residual time value. The data manager 364 may reset the oil residual time value in response to the command. The data manager 364 may also record a time-stamp of the oil change. The time-stamp may be used to determine whether oil changes are occurring according to a specified schedule.

The communications component 366 may establish a wireless connection with a mobile device 220 for transmitting and receiving commands and data. The communications component 366 may package the commands and data in manner that both the monitoring device 100 and the application on the mobile device 220 can process. For example, the communications component 366 may define various message types. In an aspect, the message types may include: configuration messages, engine on-off reporting messages, real-time messages, and refill messages.

Configuration messages may be exchanged when a connection is established between the monitoring device 100 and the mobile device 220. The mobile device 220 may request information from the operator to send to the monitoring device 100. For example, the information may include: generator serial number, engine hours, engine cycles, fuel level, oil time, generator model characteristic parameters, fuel level calculation settings, and engine RPM algorithm settings. The fuel level calculation settings and engine RPM algorithm settings may be provided by the application based on the generator model.

An engine on-off message may be sent by the monitoring device 100 to indicate the time of an on or off event. Because the on and off events may occur when a mobile device 220 is not connected to the monitoring device 100, the message may be saved in the memory of the monitoring device 100 until a connection is available. The mobile device 220 may forward the on-off message to the server 240. The on-off message may include: the generator unique ID, the cumulative engine hours, the cumulative ON-OFF cycles, the average and the maximum of the Engine RPM during the session, the average and the maximum of the total current (I value) absorption (as a sum of both plugs) during the session, and the average and the max of the voltage values during the session.

A real-time message may be requested by the application 222 and returned by the monitoring device 100. The real-time message may include any information to be displayed on the mobile device 220. For example, the real-time message may include any of the operational data discussed above. The real-time messages may be transmitted periodically as requested by the application 222. For example, the engine hours value may be transmitted every 60 seconds, while the engine RPM, I value, and V value may be transmitted more frequently, e.g., every second.

A refill message may be transmitted when an operator uses the application 222 to indicate that the portable generator 210 has been refueled or the oil has been changed. The refill message may include a counter reset command to the monitoring device 100 and related parameters (e.g., fuel level for the fuel, remaining hours to next maintenance for the oil). When a refill message is transmitted, the mobile device 220 may also transmit a message to the server 240 with similar content. The refill message may include a time-stamp that may be used to compare the refills to a specified schedule (e.g., to ensure fuel or oil is in good condition).

Figure 4:
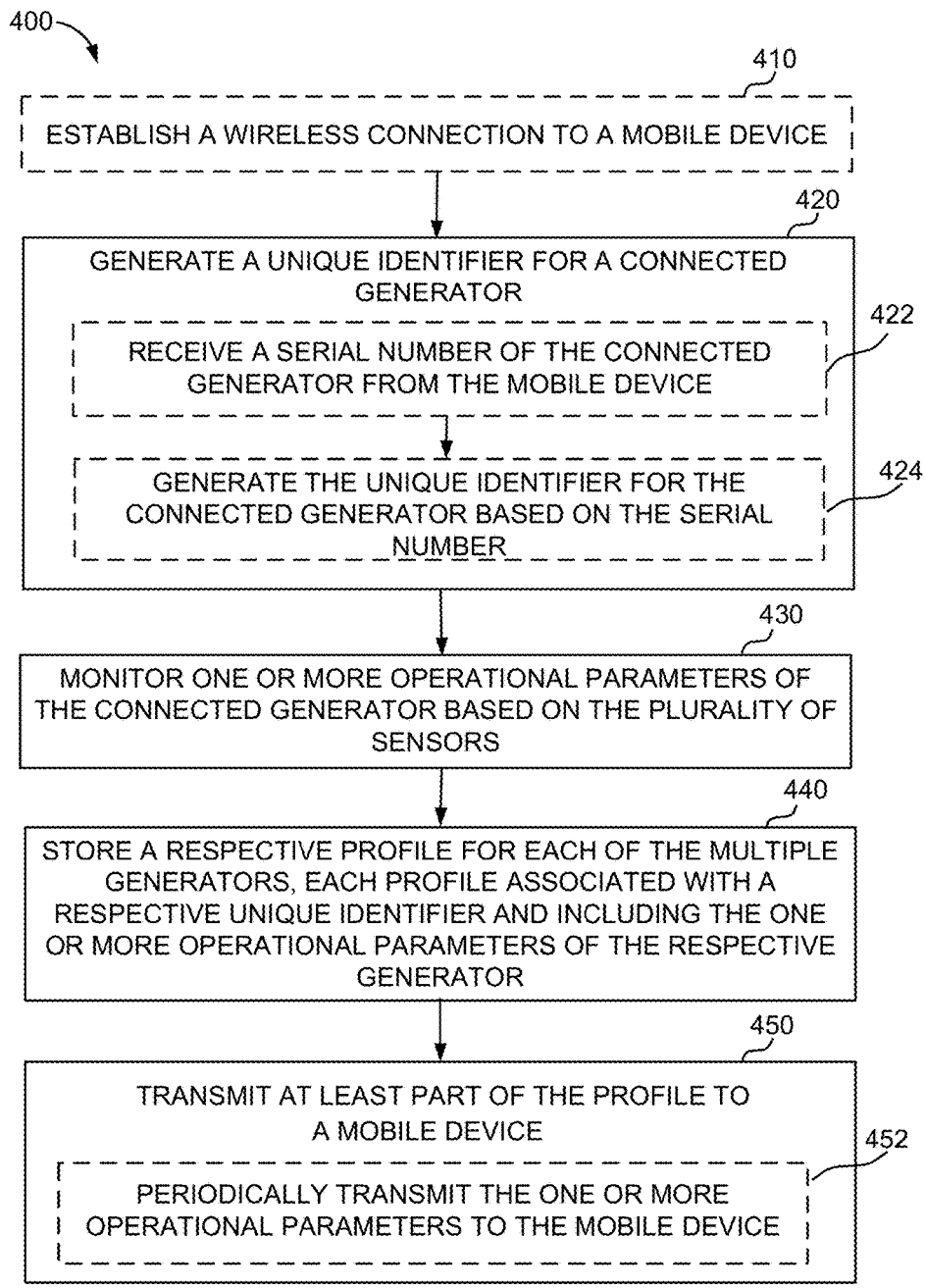
FIG. 4 is a flowchart showing an illustrative method of monitoring generators using the exemplary monitoring device according to an aspect of the present disclosure.

FIG. 4 is a flowchart showing an example method 400 of monitoring generators using a monitoring device 100. The method 400 may be performed by the monitoring device 100, which may be connected to the portable generator 210 and in communication with the mobile device 220. In an aspect, the method 400 may be performed when the monitoring device 100 is connected to a portable generator 210 and the portable generator 210 supplies power to the monitoring device 100.

At block 410, the method 400 may optionally include establishing a wireless connection to a mobile device. In an aspect, for example, the monitoring device 100 may execute the communications component 366 to establish a wireless connection to the mobile device 220. For example, the wireless connection may be a BLE connection. Upon powering on, the communications component 366 may search for a mobile device 220 or make the monitoring device 100 discoverable until a connection is established. In an aspect, the monitoring device 100 may allow a single wireless connection at any time.

At block 420, the method 400 may include generating a unique identifier for a connected generator. In an aspect, for example, the monitoring device 100 may execute the ID generator 362 to generate the unique identifier for the connected generator 210. The connected generator 210 may be one of multiple generators to which the monitoring device 100 may be connected. The unique identifier may be generated when at least one electrical plug (e.g., prongs 120) is plugged into the electrical socket of the connected generator.

For example, at block 422, the block 420 may optionally include receiving a serial number of the connected generator from the mobile device. For example, the monitoring device 100 may execute the communications component 366 to receive the serial number of the connected generator from the mobile device. The communications component 366 may also receive a model configuration including generator model characteristic parameters, fuel level calculation settings, and engine RPM algorithm settings. At block 424, the block 420 may optionally include generating the unique identifier for the connected generator based on the serial number. In an aspect, the monitoring device 100 may execute the ID generator 362 to generate the unique identifier for the connected generator based on the serial number. For example, the ID generator 362 may modify the serial number by cropping, appending additional information, or hashing to derive the unique identifier.

In block 430, the method 400 may include monitoring one or more operational parameters of the connected generator based on the plurality of sensors. In an aspect, for example, the monitoring device 100 may execute the sensor controller 340 to monitor one or more operational parameters of the connected generator 210 based on the plurality of sensors (e.g., accelerometer 242, microphone 244, and multimeter 246). The monitoring may include continuously determining a value of the operating parameter. The monitoring may also include periodically sampling the value of the operating parameter. Additionally, for operating parameters not directly measured by the plurality of sensors, the monitoring may include determining the operating parameter based on another measurement from the sensors.

In block 440, the method 400 may include storing a respective profile for each of the multiple generators, each profile associated with a respective unique identifier and including the one or more operational parameters of the respective generator. In an aspect, for example, the monitoring device may execute the data manager 364 to store a respective profile for each of the multiple generators, each profile associated with a respective unique identifier and including the one or more operational parameters of the respective generator.

In block 450, the method 400 may include transmitting at least part of the profile to a mobile device. In an aspect, for example, the monitoring device 100 may execute the communications component 366 to transmit at least part of the profile to the mobile device 220. For example, in block 452, the block 450 may include periodically transmitting the one or more operational parameters to the mobile device. For example, the communications component 366 may periodically transmit the one or more operational parameters to the mobile device 220. Transmission of the operational parameters may allow the mobile device to display current properties of the connected generator 210. In an aspect, the communications component 366 may transmit the entire profile to the mobile device (e.g., for storage).

Figure 5:
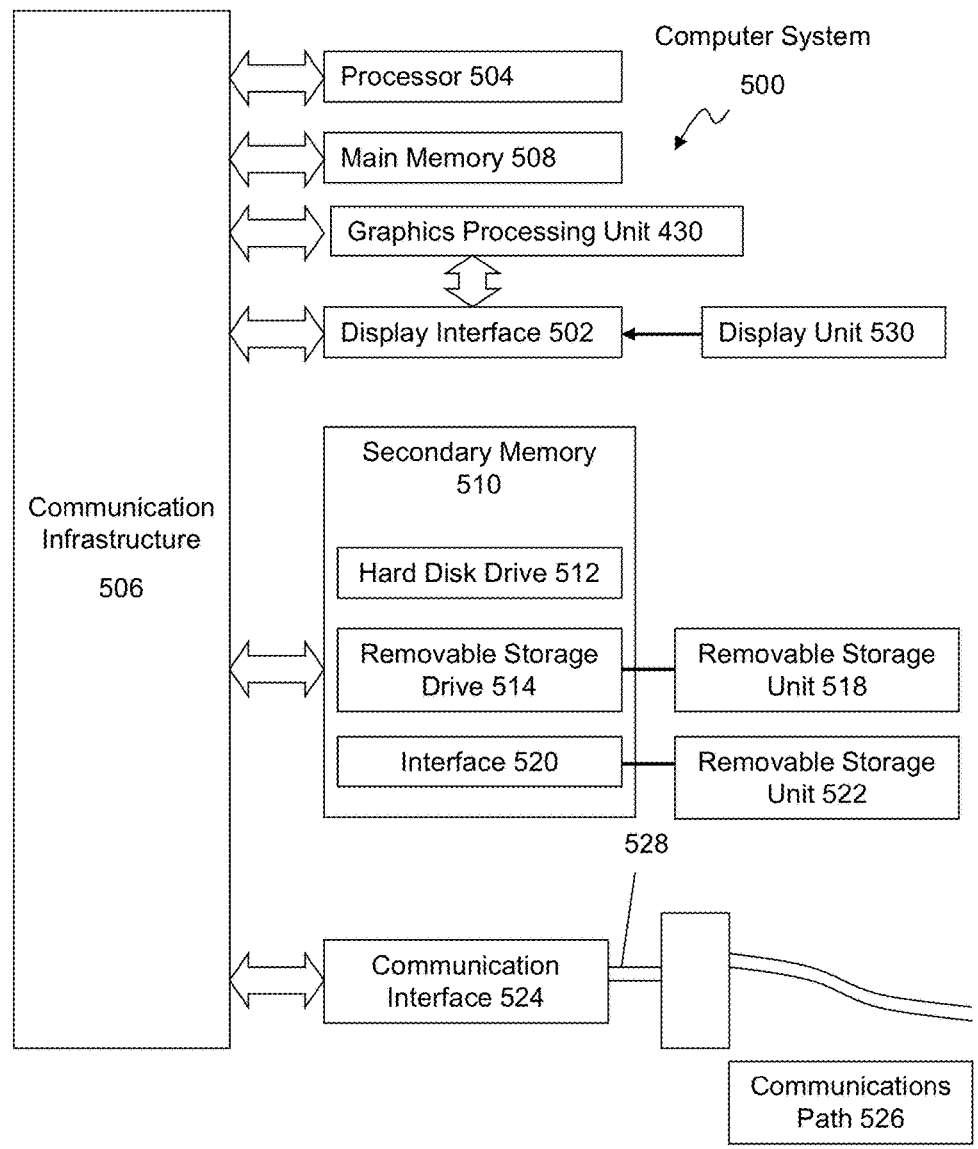
FIG. 5 presents an illustrative system diagram of various hardware components and other features for use in accordance with an aspect of the present disclosure.

Aspects of the present disclosure may be implemented using hardware, software, or a combination thereof and may be implemented in one or more computer systems or other processing systems. In one aspect, the disclosure is directed toward one or more computer systems capable of carrying out the functionality described herein. FIG. 5 presents an example system diagram of various hardware components and other features that may be used in accordance with aspects of the present disclosure. Aspects of the present disclosure may be implemented using hardware, software, or a combination thereof and may be implemented in one or more computer systems or other processing systems. In one exemplary variation, aspects of the disclosure are directed toward one or more computer systems capable of carrying out the functionality described herein. An example of such a computer system 500 is shown in FIG. 5.

Computer system 500 includes one or more processors, such as processor 504. The processor 504 is connected to a communication infrastructure 506 (e.g., a communications bus, cross-over bar, or network). Various software aspects are described in terms of this example computer system. After reading this description, it will become apparent to a person skilled in the relevant art(s) how to implement aspects of the disclosure using other computer systems and/or architectures.

Computer system 500 may include a display interface 502 that forwards graphics, text, and other data from the communication infrastructure 506 (or from a frame buffer not shown) for display on a display unit 530. Computer system 500 also includes a main memory 508, preferably random access memory (RAM), and may also include a secondary memory 510. The secondary memory 510 may include, for example, a hard disk drive 512 and/or a removable storage drive 514, representing a floppy disk drive, a magnetic tape drive, an optical disk drive, etc. The removable storage drive 514 reads from and/or writes to a removable storage unit 518 in a well-known manner. Removable storage unit 518, represents a floppy disk, magnetic tape, optical disk, etc., which is read by and written to removable storage drive 514. As will be appreciated, the removable storage unit 518 includes a computer usable storage medium having stored therein computer software and/or data.

In alternative aspects, secondary memory 510 may include other similar devices for allowing computer programs or other instructions to be loaded into computer system 500. Such devices may include, for example, a removable storage unit 522 and an interface 520. Examples of such may include a program cartridge and cartridge interface (such as that found in video game devices), a removable memory chip (such as an erasable programmable read only memory (EPROM), or programmable read only memory (PROM)) and associated socket, and other removable storage units 522 and interfaces 520, which allow software and data to be transferred from the removable storage unit 522 to computer system 500.

Computer system 500 may also include a communications interface 524. Communications interface 524 allows software and data to be transferred between computer system 500 and external devices. Examples of communications interface 524 may include a modem, a network interface (such as an Ethernet card), a communications port, a Personal Computer Memory Card International Association (PCMCIA) slot and card, etc. Software and data transferred via communications interface 524 are in the form of signals 528, which may be electronic, electromagnetic, optical or other signals capable of being received by communications interface 524. These signals 528 are provided to communications interface 524 via a communications path (e.g., channel) 526. This path 526 carries signals 528 and may be implemented using wire or cable, fiber optics, a telephone line, a cellular link, a radio frequency (RF) link and/or other communications channels. In this document, the terms "computer program medium" and "computer usable medium" are used to refer generally to media such as a removable storage drive 580, a hard disk installed in hard disk drive 570, and signals 528. These computer program products provide software to the computer system 500. Aspects of the disclosure are directed to such computer program products.

Computer programs (also referred to as computer control logic) are stored in main memory 508 and/or secondary memory 510. Computer programs may also be received via communications interface 524. Such computer programs, when executed, enable the computer system 500 to perform various features in accordance with aspects of the present disclosure, as discussed herein. In particular, the computer programs, when executed, enable the processor 504 to perform such features. Accordingly, such computer programs represent controllers of the computer system 500.

In variations where aspects of the disclosure are implemented using software, the software may be stored in a computer program product and loaded into computer system 500 using removable storage drive 514, hard disk drive 512, or communications interface 520. The control logic (software), when executed by the processor 504, causes the processor 504 to perform the functions in accordance with aspects of the disclosure as described herein. In another variation, aspects are implemented primarily in hardware using, for example, hardware components, such as application specific integrated circuits (ASICs). Implementation of the hardware state machine so as to perform the functions described herein will be apparent to persons skilled in the relevant art(s).

In yet another example variation, aspects of the disclosure are implemented using a combination of both hardware and software.

Figure 6:
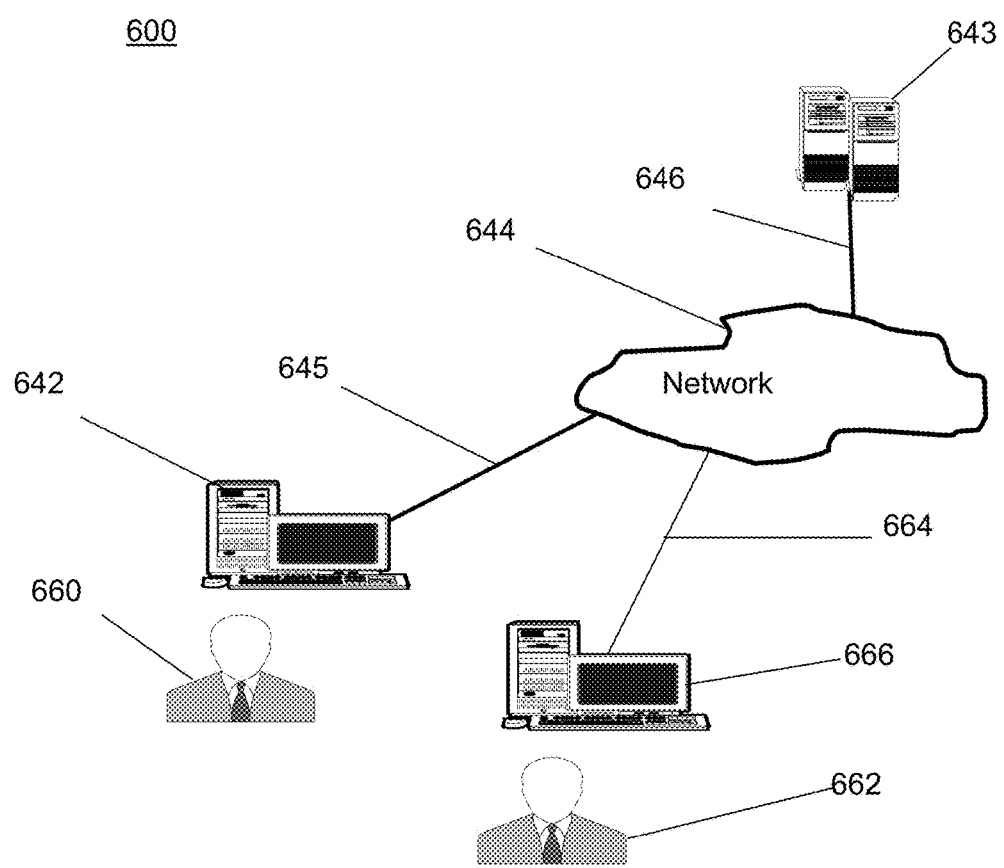
FIG. 6 is a block diagram of various illustrative system components for use in accordance with an aspect of the present disclosure.

FIG. 6 is a block diagram of various example system components that may be used in accordance with aspects of the present disclosure. For example, the various components may be within the mobile device 220, or only some of the components may be within the mobile device 220, and other components may be remote from the mobile device 220. The system 600 includes one or more accessors 660, 662 (also referred to interchangeably herein as one or more "users") and one or more terminals 642, 666 (such terminals may be or include, for example, various features for accessing the server 240). In one aspect, data for use in accordance with aspects of the present disclosure is, for example, input and/or accessed by accessors 660, 662 via terminals 642, 666, such as personal computers (PCs), minicomputers, mainframe computers, microcomputers, telephonic devices, or wireless devices, such as personal digital assistants ("PDAs") or a hand-held wireless devices coupled to a server 643, such as a PC, minicomputer, mainframe computer, microcomputer, or other device having a processor and a repository for data and/or connection to a repository for data, via, for example, a network 644, such as the Internet or an intranet, and couplings 645, 646, 664. The couplings 645, 646, 664 include, for example, wired, wireless, or fiber optic links. In another example variation, the method and system in accordance with aspects of the present disclosure operate in a stand-alone environment, such as on a single terminal.

The aspects of the disclosure discussed herein may also be described and implemented in the context of computer-readable storage medium storing computer-executable instructions. Computer-readable storage media includes computer storage media and communication media. For example, flash memory drives, digital versatile discs (DVDs), compact discs (CDs), floppy disks, and tape cassettes. Computer-readable storage media may include volatile and nonvolatile, removable and non-removable media implemented in any method or technology for storage of information such as computer readable instructions, data structures, modules or other data.

Described herein are exemplary apparatus and methods for monitoring multiple generators. More specifically, a monitoring device is described that may be attached to different generators. The monitoring device may generate a profile for each generator to which it is attached and store operational data for the respective generator. The monitoring device may transmit the profiles to a mobile device, which may be used to monitor the connected generator. The mobile device may also forward the profiles to a server that may store the profiles for access by other monitoring devices and/or mobile devices.

It will be appreciated that various implementations of the above-disclosed and other features and functions, or alternatives or varieties thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An apparatus for monitoring generators, comprising:
at least one electrical plug to connect to a respective electrical socket of multiple generators;
a plurality of sensors;
a wireless modem; and
a processor communicatively coupled to the plurality of sensors, the wireless modem, and to a memory storing executable instructions, wherein the processor:
generates a unique identifier for a connected generator of the multiple generators when the at least one electrical plug is plugged into the respective electrical socket of the connected generator;
monitors one or more operational parameters of the connected generator based on the plurality of sensors;
stores a respective profile for each of the multiple generators, each profile associated with a respective unique identifier and including the one or more operational parameters of the respective generator;
receives power from the connected generator; and
transmits the profile of the connected generator to a mobile device via the wireless modem for storage.

2. The apparatus of claim 1, wherein the processor:
establishes a wireless connection to the mobile device;
receives a serial number of the connected generator from the mobile device; and
generates the unique identifier for the connected generator based on the serial number.

3. The apparatus of claim 1, wherein the processor:
enters a startup mode upon powering on; and
stores the one or more operational parameters of the connected generator in a new profile.

4. The apparatus of claim 3, wherein the processor:
receives an identification of the connected generator;
determines that the identification matches a unique identifier of one stored profile of the multiple profiles; and
merges the new profile with the stored profile.

5. The apparatus of claim 3, wherein the processor:
receives an identification of the connected generator;
determines that the identification does not match any unique identifier of the multiple profiles; and
generates the unique identifier for the connected generator based on the identification in response to the determination.

6. The apparatus of claim 1, wherein the plurality of sensors includes an accelerometer, a microphone, and an electronic multimeter.

7. The apparatus of claim 1, wherein the processor is configured to:
detect an error condition based on output from the plurality of sensors; and
transmit a notification of the error condition to the mobile device in response to detecting the error condition.

8. The apparatus of claim 1, wherein the processor periodically transmits the one or more operational parameters to the mobile device.

9. A method of monitoring multiple generators executed by a processor of a monitoring device connected to a generator, comprising:
receiving power from the connected generator when at least one electrical plug of the monitoring device is plugged into an electrical socket of the connected generator;
generating, at the monitoring device, a unique identifier for the connected generator;
monitoring one or more operational parameters of the connected generator based on a plurality of sensors of the monitoring device;
storing a respective profile for each of the multiple generators, each profile associated with a respective unique identifier and including the one or more operational parameters of the respective generator;
transmitting, by the monitoring device, the profile of the connected generator to a mobile device via a wireless modem of the monitoring device for storage.

10. The method of claim 9, comprising establishing a wireless connection to the mobile device, wherein generating the unique identifier includes:
receiving a serial number of the connected generator from the mobile device; and
generating the unique identifier for the connected generator based on the serial number.

11. The method of claim 9, comprising:
entering a startup mode upon the monitoring device powering on; and
storing the one or more operational parameters of the connected generator in a new profile.

12. The method of claim 11, comprising:
receiving an identification of the connected generator;
determining that the identification matches a unique identifier of one stored profile of the multiple profiles; and
merging the new profile with the stored profile.

13. The method of claim 11, comprising:
receiving an identification of the connected generator;
determining that the identification does not match any unique identifier of the multiple profiles; and
generating the unique identifier for the connected generator based on the identification in response to the determination.

14. The method of claim 13, comprising:
receiving a generator model configuration including generator model characteristic parameters, fuel level calculation settings, and engine RPM algorithm settings, wherein the monitoring is based on the generator model configuration.

15. The method of claim 9, wherein the plurality of sensors includes an accelerometer, a microphone, and an electronic multimeter.

16. The method of claim 9, comprising:
detecting an error condition based on output from the plurality of sensors; and transmitting a notification of the error condition to the mobile device in response to detecting the error condition.

17. The method of claim 9, comprising periodically transmitting the one or more operational parameters to the mobile device.

18. A system for monitoring generators, comprising:
a monitoring device that obtains operational parameters of a connected generator based on a plurality of sensors, wherein the connected generator supplies power to the monitoring device;
a mobile device that receives a profile of the connected generator from the monitoring device, wherein the profile is associated with a unique identifier for the connected generator;
a server that remotely stores profiles of multiple generators and provides access to the profiles based on the unique identifier,
wherein the monitoring device:
generates the unique identifier for the connected generator of the multiple generators when at least one electrical plug of the monitoring device is plugged into an electrical socket of the connected generator;
monitors the one or more operational parameters of the connected generator based on the plurality of sensors;
stores the respective profile for each of the multiple generators, each profile associated with a respective unique identifier and including the one or more operational parameters of the respective generator;
transmits the profile of the connected generator to the mobile device via a wireless modem.

19. The system of claim 18, wherein the mobile device displays real-time operational parameters of the connected generator.

20. The system of claim 18, wherein the mobile device provides a notification regarding an error status of the connected generator.

* * * * *